(12) United States Patent
Kono et al.

(10) Patent No.: US 8,987,812 B2
(45) Date of Patent: Mar. 24, 2015

(54) SEMICONDUCTOR DEVICE AND SEMICONDUCTOR DEVICE MANUFACTURING METHOD

(75) Inventors: Hiroshi Kono, Kanagawa (JP); Takashi Shinohe, Kanagawa (JP); Makoto Mizukami, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 564 days.

(21) Appl. No.: 13/203,341

(22) PCT Filed: Jan. 6, 2010

(86) PCT No.: PCT/JP2010/000043
§ 371 (c)(1),
(2), (4) Date: Nov. 1, 2011

(87) PCT Pub. No.: WO2010/116575
PCT Pub. Date: Oct. 14, 2010

(65) Prior Publication Data
US 2012/0037922 A1 Feb. 16, 2012

(30) Foreign Application Priority Data
Mar. 30, 2009 (JP) .................................. 2009-82276

(51) Int. Cl.
*H01L 29/66* (2006.01)
*H01L 29/739* (2006.01)
(Continued)

(52) U.S. Cl.
CPC ........ *H01L 29/7397* (2013.01); *H01L 21/0465* (2013.01); *H01L 29/41766* (2013.01);
(Continued)

(58) Field of Classification Search
CPC ... H01L 29/772; H01L 29/78; H01L 29/7801; H01L 29/7802; H01L 29/7827
USPC ............................ 257/77, 328–330, E29.104, 257/E29.255–E29.257, E29.26, E29.262; 438/138
See application file for complete search history.

(56) References Cited

U.S. PATENT DOCUMENTS 6,043,126 A 3/2000 Kinzer
6,144,065 A 11/2000 Kinzer
(Continued)

FOREIGN PATENT DOCUMENTS

EP 1460681 A2 9/2004
JP 01-094672 4/1989
(Continued)

OTHER PUBLICATIONS

International Search Report for International Application No. PCT/JP2010/000043 mailed on Feb. 9, 2010.
(Continued)

*Primary Examiner* — Kenneth Parker
*Assistant Examiner* — John Lin
(74) *Attorney, Agent, or Firm* — Amin, Turocy & Watson, LLP

(57) ABSTRACT

The invention provides an ultra-low-on-resistance, excellent-reliability semiconductor device that can finely be processed using SiC and a semiconductor device producing method. A semiconductor device includes: a silicon carbide substrate; a first-conductive-type first silicon carbide layer provided on a first principal surface of the silicon carbide substrate; a second-conductive-type first silicon carbide region formed at a surface of the first silicon carbide layer; a first-conductive-type second silicon carbide region formed at a surface of the first silicon carbide region; a second-conductive-type third silicon carbide region formed below the second silicon carbide region; a trench piercing through the second silicon carbide region to reach the third silicon carbide region; a gate insulating film; a gate electrode; an interlayer insulating film with which the gate electrode is covered; a first electrode that is formed on the second silicon carbide region and the interlayer insulating film in a side surface of the trench while containing a metallic element selected from a group consisting of Ni, Ti, Ta, Mo, and W; a second electrode that is formed on the third silicon carbide region in a bottom portion of the trench and the first electrode while containing Al; a first main electrode formed on the second electrode; and a second main electrode formed on a second principal surface of the silicon carbide substrate.

10 Claims, 14 Drawing Sheets

(51) Int. Cl.
*H01L 21/04* (2006.01)
*H01L 29/417* (2006.01)
*H01L 29/45* (2006.01)
*H01L 29/78* (2006.01)
*H01L 29/16* (2006.01)
*H01L 29/423* (2006.01)

(52) U.S. Cl.
CPC .......... *H01L29/45* (2013.01); *H01L 29/66068* (2013.01); *H01L 29/7396* (2013.01); *H01L 29/7802* (2013.01); *H01L 29/7813* (2013.01); *H01L 21/0485* (2013.01); *H01L 29/1608* (2013.01); *H01L 29/42368* (2013.01)
USPC ............. 257/330; 257/77; 257/328; 257/329; 257/E29.104; 257/E29.257; 257/E29.26; 257/E29.262; 438/138

(56) References Cited

U.S. PATENT DOCUMENTS

| | | | |
|---|---|---|---|
| 7,829,374 | B2 | 11/2010 | Hayashi et al. |
| 2004/0183080 | A1 | 9/2004 | Kusumoto et al. |
| 2004/0214453 | A1 | 10/2004 | Endou et al. |
| 2005/0258479 | A1* | 11/2005 | Ono et al. ................. 257/328 |
| 2006/0097267 | A1 | 5/2006 | Kumar et al. |
| 2008/0017897 | A1 | 1/2008 | Saito et al. |
| 2010/0006894 | A1 | 1/2010 | Ohta et al. |
| 2010/0102332 | A1 | 4/2010 | Takahashi et al. |
| 2010/0123188 | A1* | 5/2010 | Venkatraman ............... 257/330 |

FOREIGN PATENT DOCUMENTS

| | | |
|---|---|---|
| JP | 03-024737 | 2/1991 |
| JP | 08-250586 | 9/1996 |
| JP | 10-189969 | 7/1998 |
| JP | 2006-128191 | 5/2006 |
| JP | 2006-135150 | 5/2006 |
| JP | 2007-207784 | 8/2007 |
| JP | 2008-053449 | 3/2008 |
| WO | 2008-114838 A1 | 9/2008 |
| WO | 2009013886 A1 | 2/2009 |

OTHER PUBLICATIONS

Office Action of Dismissal of Amendment for Japanese Patent Application No. 2009-082276 Dated May 7, 2013, 4 pgs.
Office Action of Decision of Refusal for Japanese Patent Application No. 2009-082276 Dated May 7, 2013, 2 pgs.
Dethard Peters, et al., "Electrical Performance of Triple Implanted Vertical Silicon Carbide MOSFETs with Low On-Resistance", IEEE, 1999, pp. 103-pp. 106.
Extended European Search Report for Application No. 107612830.0-1552/2416366 Dated May 15, 2013, 5 pgs.
Japanese Office Action for Japanese Application No. 2009-082276 mailed on Feb. 5, 2013.
Japanese Office Action for Japanese Application No. 2009-082276 mailed on Nov. 13, 2012.
Office Action of Notification of Reason(s) for Refusal for Japanese Patent Application No. 2013-003530 Dated Feb. 18, 2014, 7 pgs.

* cited by examiner

SEMICONDUCTOR DEVICE AND SEMICONDUCTOR DEVICE MANUFACTURING METHOD

TECHNICAL FIELD

The present invention relates to a high-voltage semiconductor device in which silicon carbide (SiC) is used.

BACKGROUND ART

The silicon carbide (hereinafter also referred to as SiC) is expected to be a material for a next generation of power semiconductor devices. Compared with Si, SiC has excellent physical properties such as a threefold band gap, about tenfold breakdown field strength, and about threefold thermal conductivity. When the physical properties of SiC are utilized, an ultra-low-power-loss power semiconductor device that can be operated at high temperatures can be implemented.

There are various high-voltage semiconductor devices in which the properties of SiC are utilized. A Double Implantation MOSFET (hereinafter referred to as a DIMOSFET) in which a p well and a source region are formed by ion implantation is well known as one of the high-voltage semiconductor devices.

The DIMOSFET is easily produced because of use of a planar process of being able to accurately form a channel by the ion implantation method. A power of a drive circuit can be reduced because a gate is driven by voltage control, whereby the DIMOSFET is also excellent for a parallel operation.

However, compared with Si, it is well known that SiC has a significantly high contact resistance between an electrode and a source contact region and p well contact region. In order to solve the problem with the significantly high contact resistance, there is well known a method, in which heating is performed up to about 1000° C. after Ti (titanium)/Al (aluminum) are stacked in the p well contact region while Ni (nickel) is evaporated in the source contact region.

However, when the method is adopted, it is necessary to perform patterning twice to the source contact region and the p well contact region. Additionally, it is necessary to take into account a misalignment of the patterning, which causes an increase in cell size. It is necessary to scale down the cell size in order to reduce an on-resistance of the MOSFET.

For example, Patent Document 1 discloses a method of establishing the contact with different materials in a P+ contact region of a bottom surface of a contact trench provided in a substrate and an N+ type source region of a side surface.

CITATION LIST

Patent Literature

Patent Document 1: Japanese Patent Application Laid-Open No. 2006-135150

SUMMARY OF INVENTORY

Technical Problem

As described above, in the conventional DIMOSFET, it is necessary to deposit different metals on the source contact region and the p well contact region in order to decrease the contact resistance. However, in order to deposit the different metals on the two contact regions, it is necessary to secure a large margin in designing an area of the contact region in consideration of the misalignment with the mask. This obstructs the fine processing technique of the cell size.

On the other hand, in the SiC semiconductor device used under high temperature, when Al is used as a material for a contact electrode, Al reacts with an interlayer insulating film such as a silicon oxide film, which possibly results in a problem in that reliability is degraded such that a short circuit is generated between the contact electrode and an interconnection.

In view of the foregoing, an object of the invention is to provide an ultra-low-on-resistance, excellent-reliability semiconductor device that can finely be processed using SiC and a semiconductor device producing method.

Solution to Problem

In accordance with a first aspect of the invention, a semiconductor device includes: a silicon carbide substrate that has first and second principal surfaces; a first-conductive-type first silicon carbide layer that is provided on the first principal surface of the silicon carbide substrate; a second-conductive-type first silicon carbide region that is formed at a surface of the first silicon carbide layer; a first-conductive-type second silicon carbide region that is formed at a surface of the first silicon carbide region; a second-conductive-type third silicon carbide region that is formed below the second silicon carbide region; a trench that is formed so as to pierce through the second silicon carbide region to reach the third silicon carbide region; a gate insulating film that is continuously formed on surfaces of the second silicon carbide region, the first silicon carbide region, and the first silicon carbide layer; a gate electrode that is formed on the gate insulating film; an interlayer insulating film with which the gate electrode is covered; a first electrode that is formed on the second silicon carbide region and the interlayer insulating film on a side surface of the trench while containing a metallic element selected from a group consisting of Ni, Ti, Ta, Mo, and W; a second electrode that is formed on the third silicon carbide region in a bottom portion of the trench and on the first electrode while containing Al; a first main electrode that is formed on the second electrode; and a second main electrode that is formed on the second principal surface of the silicon carbide substrate.

In accordance with a second aspect of the invention, a semiconductor device includes: a silicon carbide substrate that has first and second principal surfaces; a first-conductive-type first silicon carbide layer that is provided on the first principal surface of the silicon carbide substrate; a second-conductive-type first silicon carbide region that is formed at a surface of the first silicon carbide layer; a first-conductive-type second silicon carbide region that is formed at a surface of the first silicon carbide region; a second-conductive-type third silicon carbide region that is selectively formed in the first silicon carbide region; a first trench that is formed so as to pierce through the second silicon carbide region and the first silicon carbide region to reach the first silicon carbide layer; an insulator that is formed in a bottom portion of the first trench; a gate insulating film that is continuously formed on surfaces of the second silicon carbide region, the first silicon carbide region, and the first silicon carbide layer on a side surface of the first trench; a gate electrode that is formed on the gate insulating film; an interlayer insulating film with which the gate electrode is covered; a second trench that is formed so as to pierce through the second silicon carbide region to reach the third silicon carbide region; a first electrode that is formed on the second silicon carbide region and the interlayer insulating film on a side surface of the second trench while containing a metallic element selected from a group consisting of Ni, Ti, Ta, Mo, and W; a second electrode that is formed on the third silicon carbide region in a bottom portion of the second trench and on the first electrode while containing Al; a first main electrode that is formed on the second electrode; and a second main electrode that is formed on the second principal surface of the silicon carbide substrate.

In accordance with a third aspect of the invention, a semiconductor device producing method comprising: forming a first-conductive-type first silicon carbide layer on a first principal surface of a silicon carbide substrate; forming a first ion implantation mask on an upper surface of the first silicon carbide layer; forming a first silicon carbide region by ion-implanting a second-conductive-type impurity in the first silicon carbide layer using the first ion implantation mask; forming a second ion implantation mask on an upper surface of the first silicon carbide layer; forming a second silicon carbide region by ion-implanting a first-conductive-type impurity in the first silicon carbide layer using the second ion implantation mask; forming a third silicon carbide region by ion-implanting the second-conductive-type impurity in the first silicon carbide layer using the second ion implantation mask; forming continuously a gate insulating film on surfaces of the second silicon carbide region, the first silicon carbide region, and the first silicon carbide layer; forming a gate electrode on the gate insulating film; forming an interlayer insulating film on the gate electrode; forming a trench piercing through the second silicon carbide region to reach the third silicon carbide region; forming a first electrode on the second silicon carbide region on a side surface of the trench while the first electrode contains a metallic element selected from a group consisting of Ni, Ti, Ta, Mo, and W; forming a second electrode on the third silicon carbide region in a bottom portion of the trench while the second electrode contains Al; forming a first main electrode on the second electrode; and forming a second main electrode on a second principal surface of the silicon carbide substrate.

In accordance with a fourth aspect of the invention, a semiconductor device producing method comprising: forming a first-conductive-type first silicon carbide layer on a first principal surface of a silicon carbide substrate; forming a second-conductive-type first silicon carbide region at a surface of the first silicon carbide layer; forming a first-conductive-type second silicon carbide region at a surface of the first silicon carbide region; forming selectively a second-conductive-type third silicon carbide region in the first silicon carbide region; forming a first trench that pierces through the second silicon carbide region and the first silicon carbide region to reach the first silicon carbide layer; forming an insulator in a bottom portion of the first trench; forming continuously a gate insulating film on surfaces of the second silicon carbide region, the first silicon carbide region, and the first silicon carbide layer on a side surface of the first trench; forming a gate electrode on the gate insulating film; forming an interlayer insulating film on the gate electrode; forming a second trench that pierces through the second silicon carbide region to reach the third silicon carbide region; forming a first electrode on the second silicon carbide region on a side surface of the second trench while the first electrode contains a metallic element selected from a group consisting of Ni, Ti, Ta, Mo, and W; forming a second electrode on the third silicon carbide region in a bottom portion of the second trench while the second electrode contains Al; forming a first main electrode on the second electrode; and forming a second main electrode on the second principal surface of the silicon carbide substrate.

Advantageous Effects of Invention

According to the invention, the ultra-low-on-resistance, excellent-reliability semiconductor device that can finely be processed using SiC and the semiconductor device producing method can be provided.

DESCRIPTION OF EMBODIMENT

Hereinafter, embodiments of the invention will be described with reference to the drawings. As used herein, an electrode containing a metallic element (such as Ni and Al) means a concept including an electrode made of a single substance of metal, an electrode made of a metallic alloy, an electrode made of a metal semiconductor compound, and an electrode of a composite thereof. As used herein, an electrode mainly containing a certain metallic element means that a content of the metallic element is larger than contents of other elements.

First Embodiment

A semiconductor device according to a first embodiment includes: a silicon carbide substrate that has first and second principal surfaces; a first-conductive-type first silicon carbide layer that is provided on the first principal surface of the silicon carbide substrate; a second-conductive-type first silicon carbide region that is formed at a surface of the first silicon carbide layer; a first-conductive-type second silicon carbide region that is formed at a surface of the first silicon carbide region; and a second-conductive-type third silicon carbide region that is formed below the second silicon carbide region. The semiconductor device of the first embodiment also includes: a trench that is formed so as to pierce through the second silicon carbide region to reach the third silicon carbide region; a gate insulating film that is continuously formed on surfaces of the second silicon carbide region, the first silicon carbide region, and the first silicon carbide layer; a gate electrode that is formed on the gate insulating film; and an interlayer insulating film with which the gate electrode is covered. The semiconductor device of the first embodiment also includes: a first electrode that is formed on the second silicon carbide region and the interlayer insulating film on a side surface of the trench while containing a metallic element selected from a group consisting of Ni, Ti, Ta, Mo, and W; a second electrode that is formed on the third silicon carbide region in a bottom portion of the trench and on the first electrode while containing Al; a first main electrode that is formed on the second electrode; and a second main electrode that is formed on the second principal surface of the silicon carbide substrate.

Figure 1:
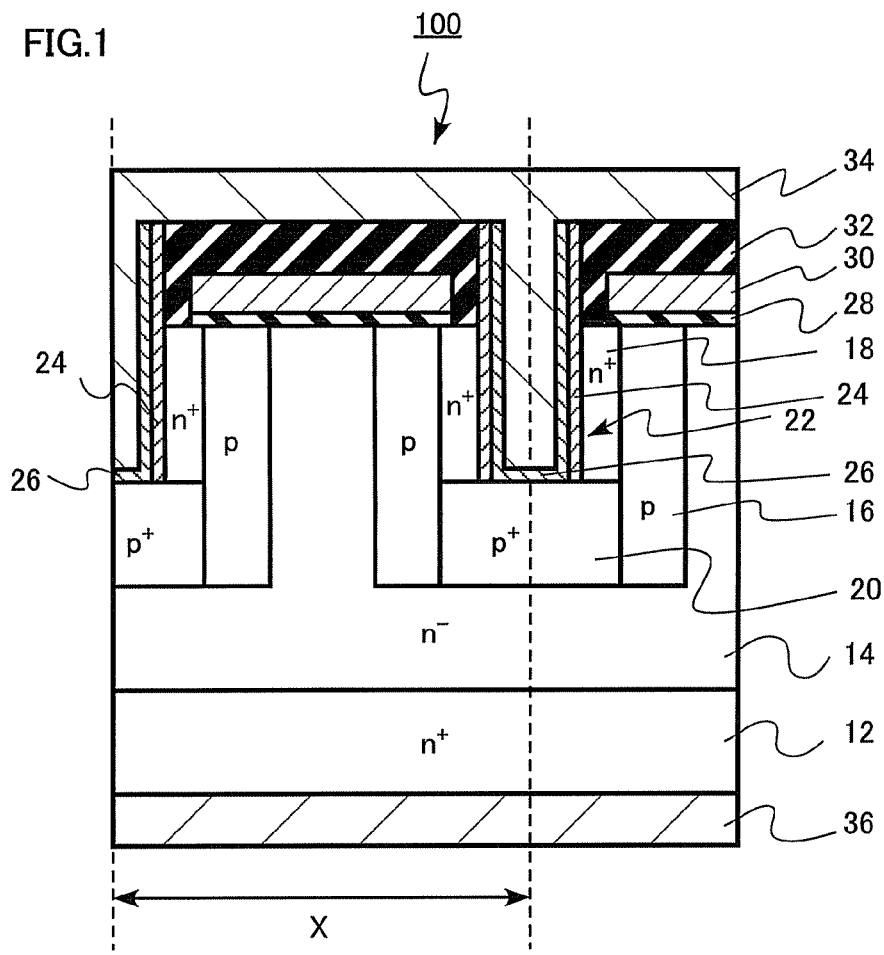
FIG. 1 is a sectional view illustrating a configuration of a MOSFET that is of a semiconductor device according to a first embodiment.

FIG. 1 is a sectional view illustrating a configuration of a MOSFET that is of the semiconductor device of the first embodiment. A MOSFET 100 includes a SiC substrate (silicon carbide substrate) 12 having first and second principal surfaces. In FIG. 1, the first principal surface means an upside surface while the second principal surface means a downside surface. For example, the SiC substrate 12 is a hexagonal SiC substrate (n$^+$ substrate) containing N (nitrogen) as an n type impurity of which an impurity concentration ranges from about $5\times10^{18}$ to about $1\times10^{19}$ cm$^{-3}$.

A first SiC layer (n– layer) 14 is formed on the first principal surface of the SiC substrate 12 while containing an n type impurity of which the impurity concentration ranges from about $5\times10^{15}$ to about $2\times10^{16}$ cm$^{-3}$. For example, the n$^-$ layer 14 has thicknesses of about 5 to about 10 μm.

A p type first SiC region (p well region) 16 is formed in part of a surface of the n$^-$ layer 14 while containing an p type impurity of which the impurity concentration ranges from about $1\times10^{17}$ to about $5\times10^{17}$ cm$^{-3}$. For example, the p well region 16 has the depth of about 0.9 μm.

An n type second SiC region (source region) 18 is formed in part of the surface of the first SiC region (p well region) 16 while containing the n type impurity of which the impurity concentration is about $1\times10^{20}$ cm$^{-3}$. For example, the source region 18 has the depth of about 0.6 μm.

An p type third SiC region (p well contact region) 20 is formed below the second SiC region (source region) 18 while containing the p type impurity of which the impurity concentration ranges from about $1\times10^{19}$ to about $1\times10^{20}$ cm$^{-3}$.

The MOSFET 100 also includes a gate insulating film 28 continuously formed in the surfaces of the second SiC region (source region) 18, the first SiC region (p well region) 16, and the first SiC layer (n$^-$ layer) 14 while striding over the regions and layer. For example, a Si oxide film and a high-k insulating film can be used as the gate insulating film 28.

A gate electrode 30 is formed on the gate insulating film 28. For example, the gate electrode 30 is made of polysilicon. An interlayer insulating film 32 made of, for example, a silicon oxide film, is formed on the gate electrode.

A trench 22 is formed while piercing through the second SiC region (source region) 18 to reach the third SiC region (p well contact region) 20. The MOSFET 100 also includes a first electrode (source contact electrode) 24 that is formed on the source region 18 and the interlayer insulating film 32 on a side surface of the trench 22 while containing a metallic element selected from a group consisting of Ni, Ti, Ta, Mo, and W. The MOSFET 100 also includes a second electrode (p well contact electrode) 26 that is formed on the p well contact region 20 in a bottom portion of the trench 22 and on the first electrode 24 in the side surface of the trench while containing Al as the metallic element.

The first electrode 24 has the thickness of about 50 nm and contains the metallic element selected from the group consisting of Ni, Ti, Ta, Mo, and W. For example, the first electrode 24 is made of NiSi, TiN, or TaN. The electrode mainly containing the above-described metallic elements has a low Schottky barrier for an electron, thereby achieving a low resistance.

In the second electrode 26, Ti (titanium)/Al (aluminum) is stacked with the thickness of about 100 nm. The electrode that mainly contains Ti and Al is preferably used as the second electrode 26 because the electrode has the low Schottky barrier for the hole to be able to achieve the low resistance. Alternatively, for example, the second electrode 26 may mainly contain only Al or AlSi.

A first main electrode (source-p well common electrode) 34 is formed on the first electrode 24 and the second electrode 26. A second main electrode (drain electrode) 36 is formed on the second principal surface of the SiC substrate 12.

In the first embodiment, preferably P (phosphorus) is used as the n type impurity. Alternatively, for example, N (nitrogen) or As (arsenic) may be used as the n type impurity. Preferably Al (aluminum) is used as the p type impurity. Alternatively, for example, B (boron) may be used as the p type impurity.

The MOSFET 100 of the first embodiment has the configuration in which the source contact electrode and the p well contact electrode are provided in the trench, which allows reduction of a contact resistance and finer processing of a cell size to be simultaneously achieved. Accordingly, the ultra-low-on-resistance, high-driving performance MOSFET can be implemented in the first embodiment.

Conventionally, the source contact electrode and the p well contact electrode are formed on a device surface side, namely, in the source region and the p well region on the same surface as the surface of FIG. 1 on which the gate insulating film is formed, respectively. Therefore, a percentage of a region where the contact electrode is formed is increased in the cell size when the cell is viewed from above, which obstructs the fine processing. It is necessary to enlarge a planar contact area in order to reduce the contact resistance, and there is a trade-off relationship between the contact resistance and the cell size.

When electrode materials suitable for the source contact electrode and the p well contact electrode are used, it is necessary to provide a processing margin such as an alignment margin of lithography, and therefore the cell size is further enlarged.

In the MOSFET 100 of the first embodiment, the source contact electrode 24 and the p well contact electrode 26 are formed in the same trench 22. The source contact electrode 24 is formed in the side surface portion of the trench 22. Therefore, the percentage of the region where the source contact electrode 24 is formed is significantly small and substantially equal to zero in the cell size when the cell is viewed from above, which allows the finer processing of the cell size to be achieved.

A channel region per unit area of a device is increased by finely processing the cell size when viewed from above, and a channel on-resistance per unit area of the device can be reduced.

In the MOSFET 100 of the first embodiment, the material of which the Schottky barrier height is lowered for the hole is used as the p well contact electrode 26, and the material of which the Schottky barrier height is lowered for the electron is used as the source contact electrode 24. Accordingly, the improvement of the driving performance and the stable operation can be achieved in the MOSFET.

The MOSFET 100 of the first embodiment is configured such that the first electrode 24 containing the metallic element selected from the group consisting of Ni, Ti, Ta, Mo, and W is interposed between the second electrode 26 containing Al and the interlayer insulating film 32. The semiconductor device made of the SiC can be operated at high temperature of 200° C. or more. On the other hand, in such high-temperature operating environments, there is a risk that a reaction between the interlayer insulating film and the electrode advances to generate a degradation of the reliability such as a short circuit between the electrodes. When the material containing Al is used as the electrode while the silicon oxide film containing Si is used as the interlayer insulating film, silicidation of Al advances to increase the risk of the degradation of the reliability.

In the MOSFET 100, in order that the electrode that contains Al having the high reactivity with the interlayer insulating film is prevented from directly coming into contact with the interlayer insulating film as much as possible, the electrode containing the metallic element selected from the group consisting of Ni, Ti, Ta, Mo, and W, which have the reactivity with the interlayer insulating film lower than that of Al, is interposed between the interlayer insulating film and the electrode containing Al. Therefore, the reaction between Al and the interlayer insulating film is prevented and the degradation of the reliability is suppressed. Accordingly, the excellent-reliability semiconductor device can be implemented. Specifically, for example, the degradation of the reliability relating to the withstanding voltage of the interlayer insulating film 32 between the gate electrode 30 and the first main electrode 34 is suppressed.

Figure 2:
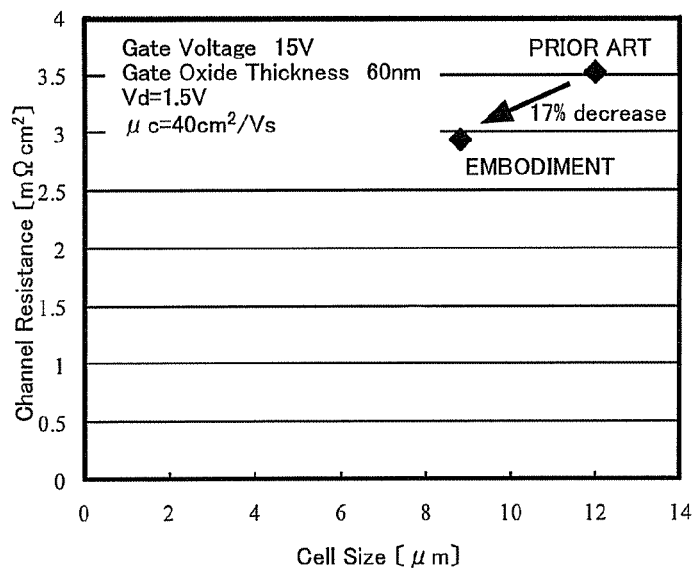
FIG. 2 is a view illustrating an example of a channel resistance reducing effect in the first embodiment.

FIG. 2 is a view illustrating an example of a channel resistance reducing effect in the prior art and the first embodiment. A horizontal axis indicates a cell size as a length (X in FIG. 1) of one side of the cell. A vertical axis indicates a channel resistance per 1 square centimeter in the surface of the device. The measurement is performed under conditions illustrated in FIG. 2.

In the example of FIG. 2, the cell size of the prior art is 12 μm. In the cell size of 12 μm, 6.6 μm is the region where the contact is formed. At this point, it is assumed that the contact electrode is made of a single material. According to the first embodiment, compared with the prior art, the region where the contact is formed can be reduced to 3.4 μm from 6.6 μm by forming the trench, which allows the finer processing of the cell size to be achieved to 8.8 μm. As a result, as illustrated in FIG. 2, the channel resistance can be decreased by 17% compared with the prior art.

In the prior art, the cell size is enlarged to 13 μm when the source contact electrode 24 and the p well contact electrode 26 are made of the different materials like the first embodiment. The reduced amount of channel resistance is further increased when the first embodiment is compared to the case in which the source contact electrode 24 and the p well contact electrode 26 are made of the different materials.

According to the first embodiment, an area of an interface of the source contact electrode 24 can be enlarged without increasing the cell size by increasing depths of the source region 18 and the trench 22. Therefore, desired low-resistance contact can be achieved.

A method for producing the semiconductor device of the first embodiment will be described below. FIGS. 3 to 10 are process sectional views illustrating the method for producing the semiconductor device of the first embodiment.

Figure 3:
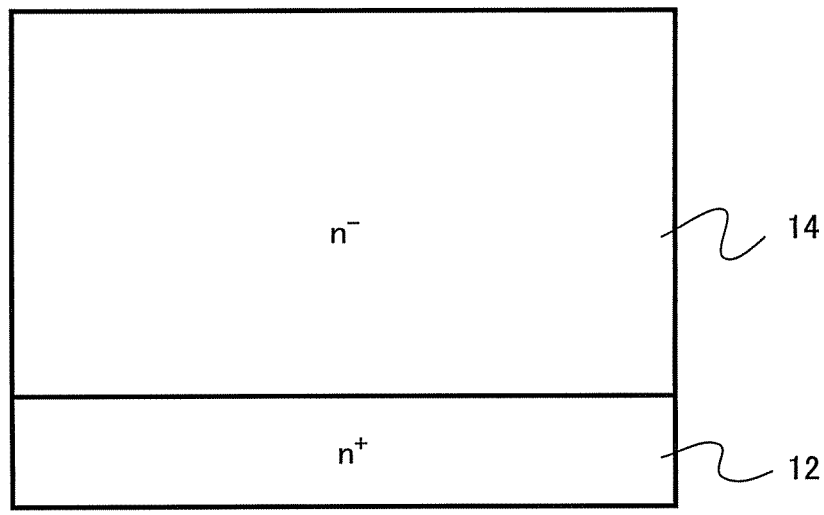
FIG. 3 is a process sectional view illustrating a method for producing the semiconductor device of the first embodiment.

As illustrated in FIG. 3, the low-resistance SiC substrate 12 having the hexagonal crystal lattice is prepared. The SiC substrate 12 contains P or N as the n type impurity of which the impurity concentration is about $1 \times 10^{19}$ cm$^{-3}$, and the SiC substrate 12 has the thickness of 300 μm. The high-resistance SiC layer 14 having the thickness of about 10 μm is grown on the SiC substrate 12 by epitaxial growth. The SiC layer 14 contains N as the n type impurity having the impurity concentration of about $5 \times 10^{15}$ cm$^{-3}$.

Figure 4:
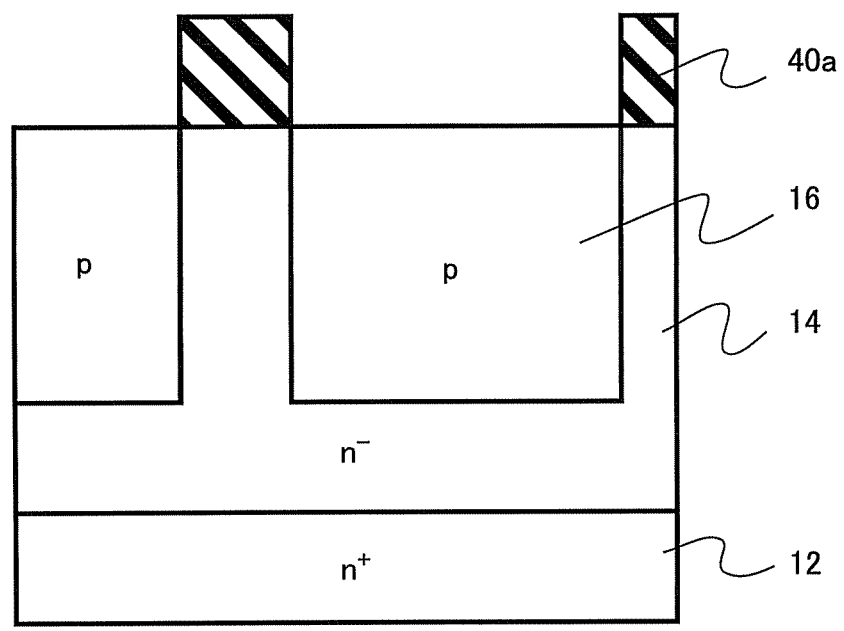
FIG. 4 is a process sectional view illustrating the method for producing the semiconductor device of the first embodiment.

As illustrated in FIG. 4, SiO$_2$ 40a is patterned on the upper surface of the SiC layer 14 to form a first ion implantation mask. Using the first ion implantation mask, Al that is of the p type impurity is ion-implanted in the SiC layer 14 to form the p well region 16.

Figure 5:
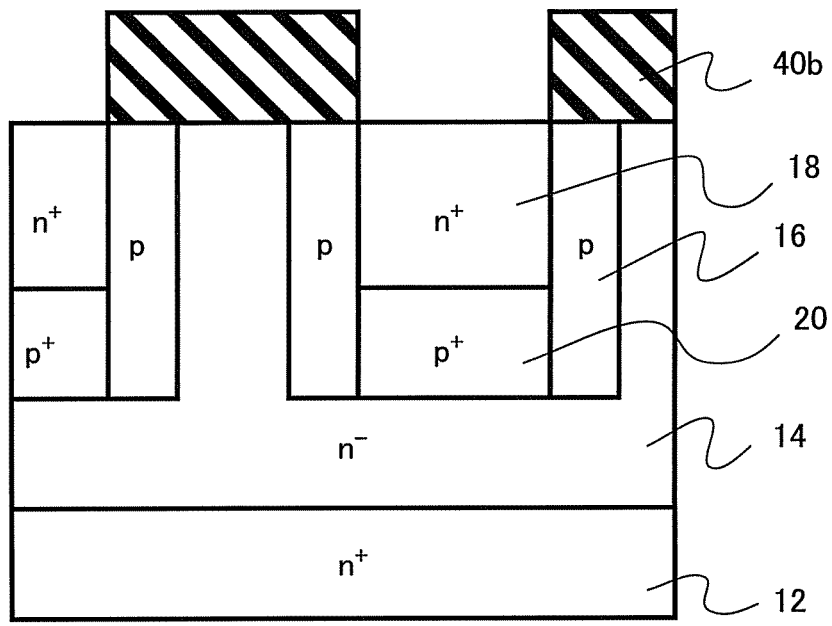
FIG. 5 is a process sectional view illustrating the method for producing the semiconductor device of the first embodiment.

As illustrated in FIG. 5, SiO$_2$ 40b is patterned on the upper surface of the SiC layer 14 to form a second ion implantation mask. Using the second ion implantation mask, P that is of the n type impurity is ion-implanted in the SiC layer 14 to form the source region 18. Further, using the second ion implantation mask, Al that is of the p type impurity is ion-implanted in the SiC layer 14 to form the p well contact region 20. Then, for example, the ion-implanted impurity is activated by a heat treatment at a temperature of about 1600° C.

Thus, the source region 18 and the p well contact region 20 are formed using the same ion implantation mask in the first embodiment, while the source region 18 and the p well contact region 20 are formed using the different ion implantation masks in the prior art. Accordingly, simplification of a producing process can be achieved.

Figure 6:
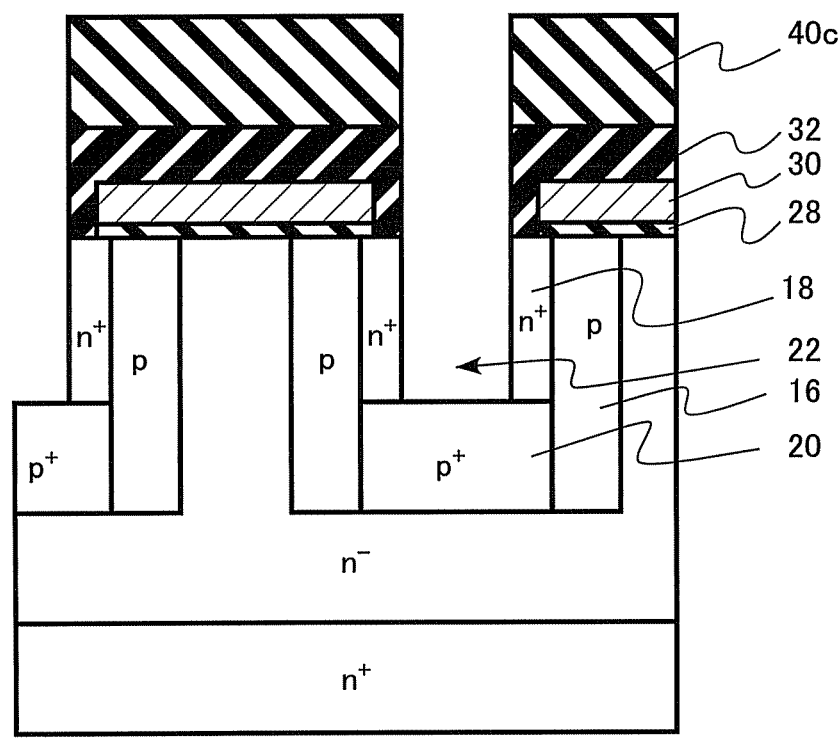
FIG. 6 is a process sectional view illustrating the method for producing the semiconductor device of the first embodiment.

As illustrated in FIG. 6, the gate insulating film 28 is continuously formed in the surfaces of the source region 18, the p well region 16, and the SiC layer 14. For example, the gate insulating film 28 is formed by a thermal oxidation method or a CVD method. After a polysilicon film is deposited on the gate insulating film 28, patterning is performed by the lithography and an RIE method to form the gate electrode 30.

Then the interlayer insulating film 32 is deposited on the gate electrode 30. Then the interlayer insulating film 32 is patterned by the RIE method with a resist 40c as a mask. Using the same resist mask, the trench 22 is formed by, for example, the RIE method while piercing through the source region 18 to reach the p well contact region 20.

Figure 7:
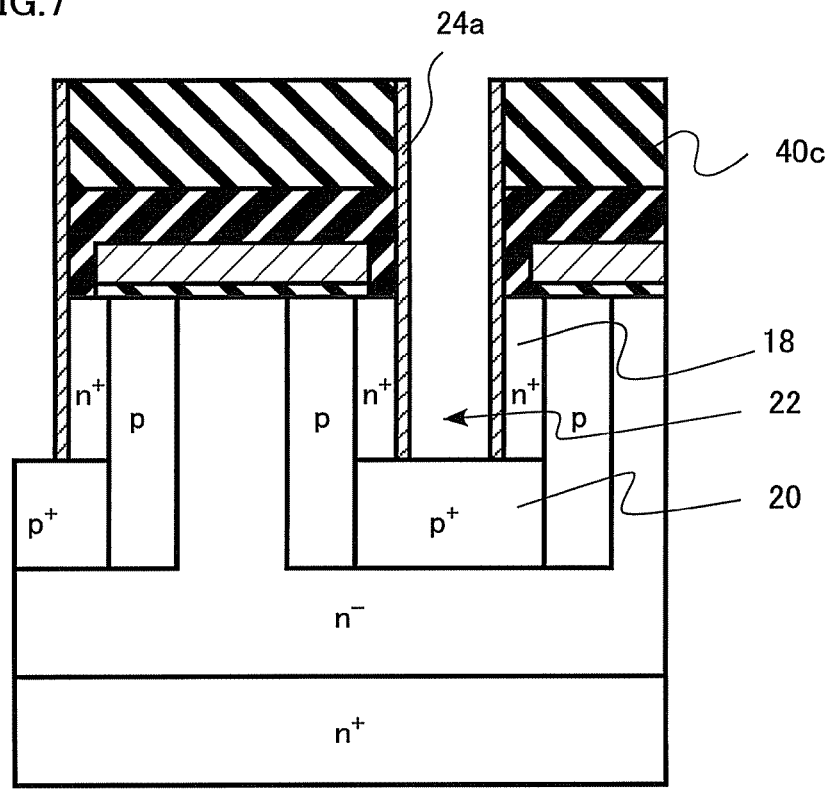
FIG. 7 is a process sectional view illustrating the method for producing the semiconductor device of the first embodiment.

As illustrated in FIG. 7, for example, a metallic film 24a made of Ni is deposited by an evaporation method or a sputtering method. Then, the metallic film 24a in the bottom portion of the trench 22 is removed by anisotropic etching such as the RIE method.

Figure 8:
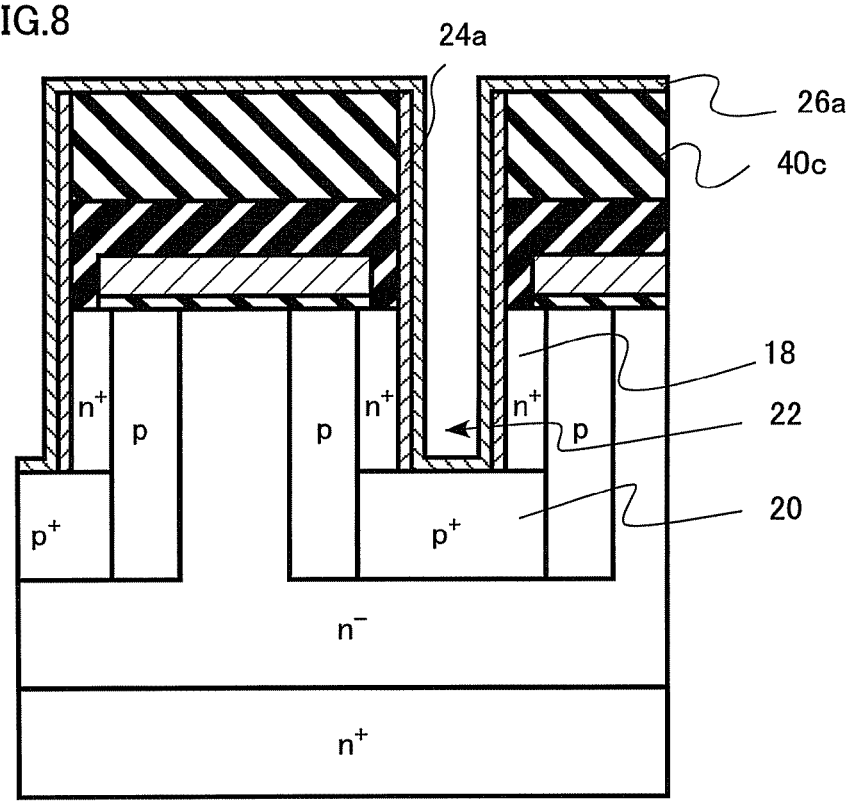
FIG. 8 is a process sectional view illustrating the method for producing the semiconductor device of the first embodiment.

As illustrated in FIG. 8, for example, a metallic film 26a made of Ti and Al is deposited by the sputtering method.

Figure 9:
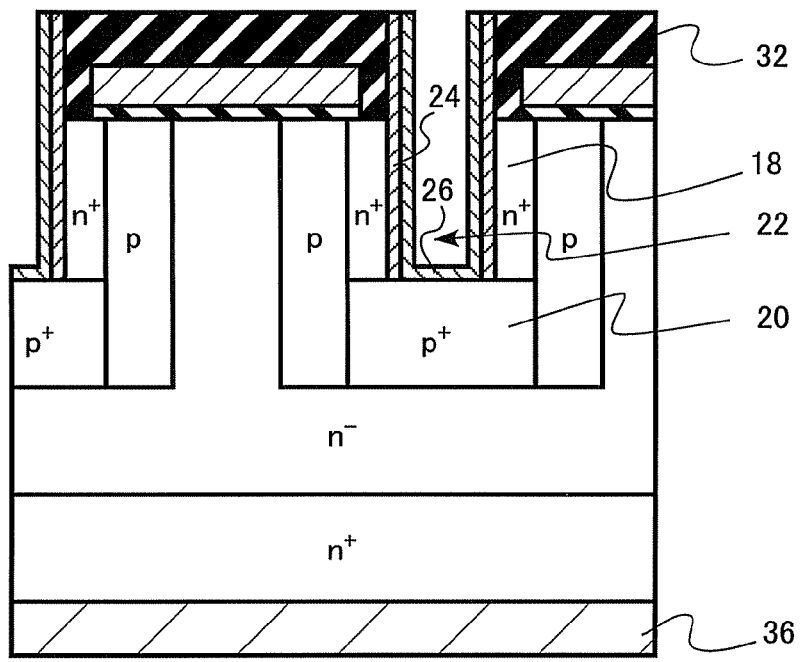
FIG. 9 is a process sectional view illustrating the method for producing the semiconductor device of the first embodiment.

As illustrated in FIG. 9, the unnecessary metallic film is lifted off by peeling off the resist 40c.

As illustrated in FIG. 9, the first electrode (source contact electrode) 24 is formed on the source region 18 and the interlayer insulating film 32 on the side surface of the trench 22 while containing a metallic element selected from a group consisting of Ni, Ti, Ta, Mo, and W, and the second electrode (p well contact electrode) 26 is formed on the p well contact region 20 in the bottom portion of the trench 22 and on the first electrode 24 in the side surface of the trench 22 while containing Al.

Then, for example, the metallic film made of Ni is evaporated to form the second main electrode 36 on the second principal surface side, namely, the rear surface side of the SiC substrate 12. The second main electrode 36 is the drain electrode. Then, for example, the Ni metallic film is caused to react with the SiC substrate 12 by the heat treatment at the temperature of about 950° C. At the same time, the metallic films 24a and 26a are caused to react with SiC of the source region 18 and SiC of the p well contact region 20.

Figure 10:
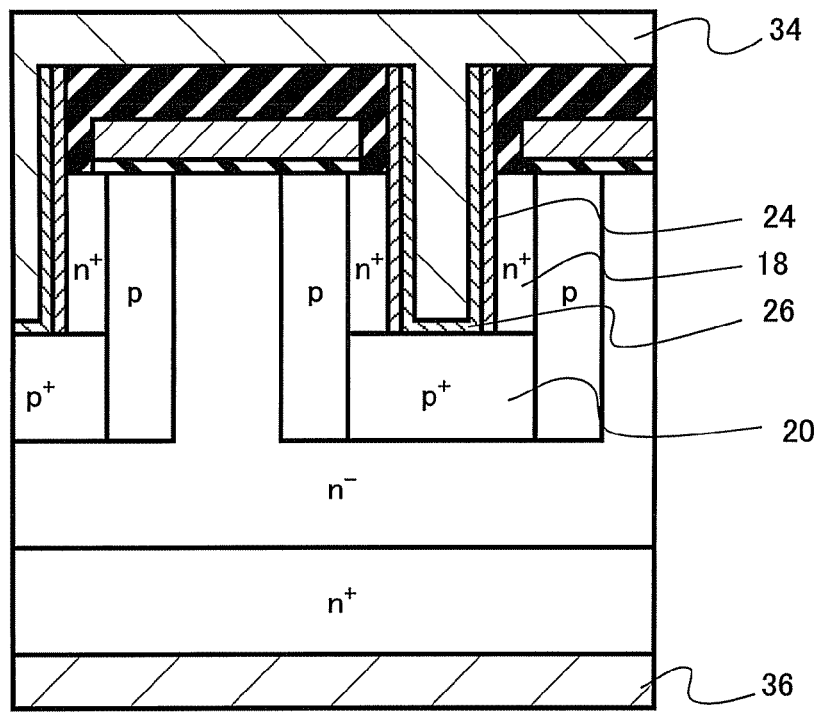
FIG. 10 is a process sectional view illustrating the method for producing the semiconductor device of the first embodiment.

As illustrated in FIG. 10, the metallic film made of Al is deposited on the p well contact electrode 26 and the source contact electrode 24 by, for example, the sputtering method to form the first main electrode 34. The first main electrode 34 is the source-p well common electrode. Thus, the MOSFET 100 of FIG. 1 is formed.

According to the method for producing the semiconductor device of the first embodiment, the ultra-low-on-resistance, high-driving-performance, excellent-reliability MOSFET can be produced through the simple process.

Second Embodiment

The MOSFET of the first embodiment has the n type SiC substrate. On the other hand, a semiconductor device according to a second embodiment has a p type SiC substrate to constitute an IGBT (Insulated Gate Bipolar Transistor). The overlapping description is not repeated here because the second embodiment differs from the first embodiment only in the impurity type of the SiC substrate.

Figure 11:
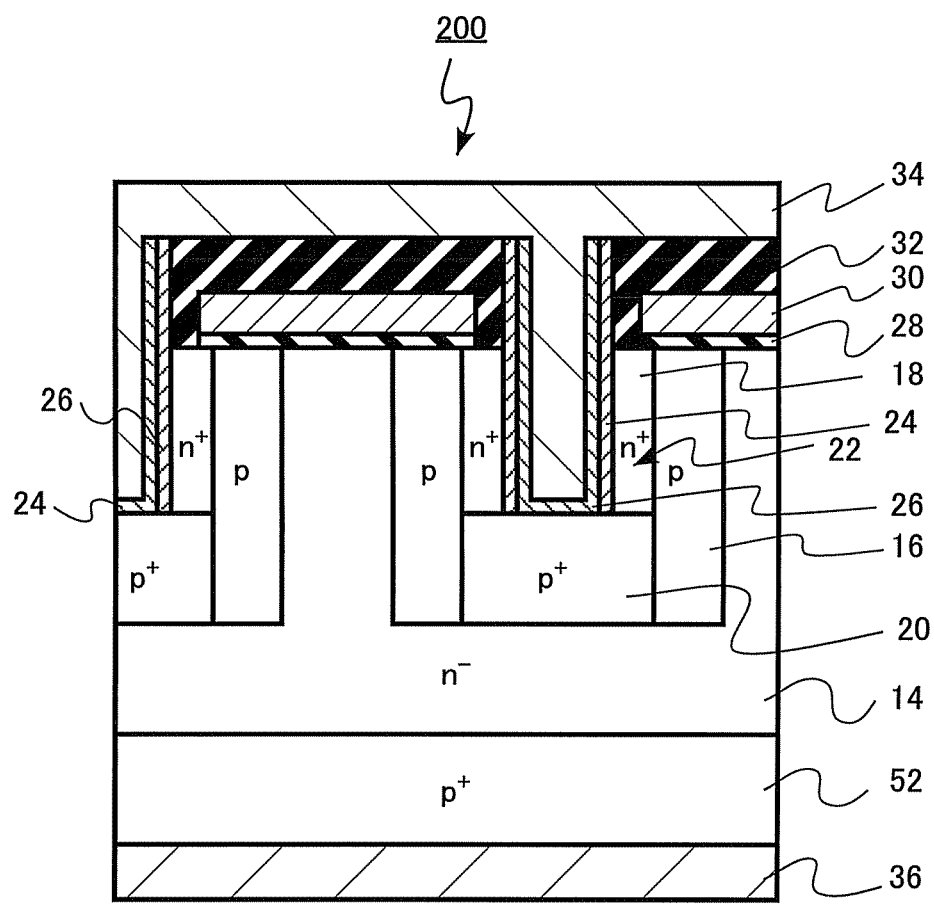
FIG. 11 is a sectional view illustrating a configuration of an IGBT that is of a semiconductor device according to a second embodiment.

FIG. 11 is a sectional view illustrating a configuration of the IGBT that is of the semiconductor device of the second embodiment. An IGBT 200 includes a SiC substrate (silicon carbide substrate) 52 having the first and second principal surfaces. In FIG. 11, the first principal surface means the upside surface while the second principal surface means the downside surface. For example, the SiC substrate 52 is a hexagonal SiC substrate ($p^+$ substrate) containing Al as the p type impurity of which the impurity concentration ranges from about $5\times10^{18}$ to about $1\times10^{19}$ cm$^{-3}$.

The IGBT 200 of the second embodiment has the configuration in which the source contact electrode and the p well contact electrode are provided in the trench, which allows the reduction of the contact resistance and the finer processing of the cell size to be simultaneously achieved. Accordingly, the ultra-low-on-resistance, high-driving-performance, excellent-reliability IGBT can be implemented in the second embodiment.

The method for producing the semiconductor device of the second embodiment differs from that of the first embodiment only in that the prepared SiC substrate is the hexagonal SiC substrate ($p^+$ substrate) containing, for example, Al as the p type impurity. According to the method for producing the semiconductor device of the second embodiment, the ultra-low-on-resistance, high-driving-performance, excellent-reliability IGBT can be produced through the simple process.

Third Embodiment

A semiconductor device according to a third embodiment includes: a silicon carbide substrate that has a first and second principal surfaces; a first-conductive-type first silicon carbide layer that is provided on the first principal surface of the silicon carbide substrate; a second-conductive-type first silicon carbide region that is formed at a surface of the first silicon carbide layer; a first-conductive-type second silicon carbide region that is formed at a surface of the first silicon carbide region; and a second-conductive-type third silicon carbide region that is selectively formed in the first silicon carbide region. The semiconductor device of the third embodiment also includes: a first trench that is formed so as to pierce through the second silicon carbide region and the first silicon carbide region to reach the first silicon carbide layer; an insulator that is formed in a bottom portion of the first trench; a gate insulating film that is continuously formed on surfaces of the second silicon carbide region, the first silicon carbide region, and the first silicon carbide layer on a side surface of the first trench; a gate electrode that is formed on the gate insulating film; and an interlayer insulating film with which the gate electrode is covered. The semiconductor device of the third embodiment also includes: a second trench that is formed so as to pierce through the second silicon carbide region to reach the third silicon carbide region; a first electrode that is formed on the second silicon carbide region and the interlayer insulating film on a side surface of the second trench while containing a metallic element selected from a group consisting of Ni, Ti, Ta, Mo, and W; a second electrode that is formed on the third silicon carbide region in a bottom portion of the second trench and on the first electrode while containing Al; a first main electrode that is formed on the second electrode; and a second main electrode that is formed on the second principal surface of the silicon carbide substrate.

The semiconductor device of the third embodiment is what is called a trench MOSFET in which the side surface of the trench constitutes the channel region. Similarly to the first embodiment, the MOSFET of the third embodiment has the configuration in which the source contact electrode and the p well contact electrode are provided in the trench. Therefore, the descriptions of contents overlapping those of the first embodiment are not repeated here.

Figure 12:
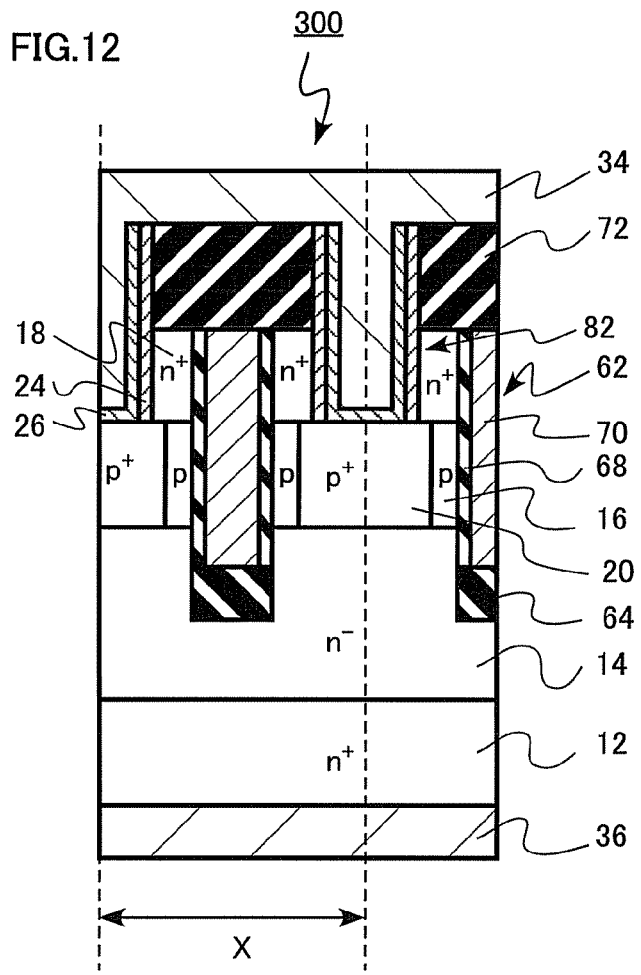
FIG. 12 is a sectional view illustrating a configuration of a MOSFET that is of a semiconductor device according to a third embodiment.

FIG. 12 is a sectional view illustrating a configuration of the MOSFET that is of the semiconductor device of the third embodiment. A MOSFET 300 includes the SiC substrate (silicon carbide substrate) 12 having the first and second principal surfaces. In FIG. 1, the first principal surface means the upside surface while the second principal surface means the downside surface. For example, the SiC substrate 12 is the hexagonal SiC substrate (n⁺ substrate) containing N (nitrogen) as the n type impurity of which the impurity concentration ranges from about $5 \times 10^{18}$ to about $1 \times 10^{18}$ cm$^{-3}$.

An n type first SiC layer (n⁻ layer) 14 is formed on the first principal surface of the SiC substrate 12 while containing the n type impurity of which the impurity concentration ranges from about $5 \times 10^{15}$ to about $2 \times 10^{16}$ cm$^{-3}$. For example, the n⁻ layer 14 has thicknesses of about 5 to about 10 μm.

A p type first SiC region (p well region) 16 is formed on the surface of the n⁻ layer 14 while containing the p type impurity of which the impurity concentration ranges from about $1 \times 10^{17}$ to about $5 \times 10^{17}$ cm$^{-3}$. For example, the p well region 16 has the depth of about 0.9 μm.

The n type second SiC region (source region) 18 is formed in part of the surface of the first SiC region (p well region) 16 while containing the n type impurity of which the impurity concentration is about $1 \times 10^{20}$ cm$^{-3}$. For example, the source region 18 has the depth of about 0.3 μm.

The p type third SiC region (p well contact region) 20 is selectively formed in the p well region 16 while containing the p type impurity of which the impurity concentration ranges from about $1 \times 10^{19}$ to about $1 \times 10^{20}$ cm$^{-3}$.

A first trench 62 is formed so as to pierce through the source region 18 and the p well region 16 to reach the n⁻ layer 14. An insulator 64 made of, for example, Si oxide is formed in the bottom portion of the first trench 62.

In the side surface of the first trench 62, a gate insulating film 68 is continuously formed on the surfaces of the source region 18, the p well region 16, and the n⁻ layer 14. For example, a Si oxide film and a high-k insulating film can be used as the gate insulating film 68.

A gate electrode 70 is formed on the gate insulating film 68. For example, the gate electrode 70 is made of polysilicon. For example, an interlayer insulating film 72 that is of a silicon oxide film is formed on the gate electrode 70 such that the gate electrode 70 is covered therewith.

A second trench 82 is formed so as to pierce through the second SiC region (source region) 18 to reach the third SiC region (p well contact region) 20. The MOSFET 300 also includes the first electrode (source contact electrode) 24 that is formed on the source region 18 and the interlayer insulating film 72 on the side surface of the second trench 82 while containing the metallic element selected from the group consisting of Ni, Ti, Ta, Mo, and W and the second electrode (p well contact electrode) 26 that is formed on the p well contact region 20 in the bottom portion of the second trench 82 while containing Al.

The first electrode (source contact electrode) 24 has the thickness of about 50 nm and contains the metallic element selected from the group consisting of Ni, Ti, Ta, Mo, and W. For example, the first electrode 24 is made of NiSi, TiN, or TaN. The metallic electrode mainly containing the above-described metallic elements has a low Schottky barrier for an electron, thereby achieving a low resistance.

In the second electrode 26, Ti (titanium)/Al (aluminum) is stacked with the thickness of about 100 nm. The metallic electrode that mainly contains Ti and Al is preferably used as the second electrode (p well contact electrode) 26 because the metallic electrode has the low Schottky barrier for the hole to be able to achieve the low resistance. Alternatively, for example, the second electrode 26 may mainly contain only Al or AlSi.

The first main electrode (source-p well common electrode) 34 is formed on the first electrode 24 and the second electrode 26. The second main electrode (drain electrode) 36 is formed on the second principal surface of the SiC substrate 12.

Similarly to the MOSFET of the first embodiment, the MOSFET 300 of the third embodiment has the configuration in which the source contact electrode and the p well contact electrode are provided in the trench, which allows the reduction of the contact resistance, the finer processing of the cell size, and the improvement of the reliability to be simultaneously achieved. In addition to the first embodiment, the structure of the trench MOSFET can further achieve the fine processing of the cell size. The reliability can also be improved. Accordingly, the ultra-low-on-resistance, high-driving performance, excellent-reliability MOSFET can be implemented in the third embodiment.

The MOSFET 300 of the third embodiment is the trench MOSFET. In the trench MOSFET of the prior art, the gate insulating film and the gate electrode are provided in the trench so as to decrease a percentage of a gate structure in the cell size when the cell is viewed from above, thereby achieving the finer processing of the cell size. However, for this reason, the percentage of the region where the contact electrode is formed is significantly increased in the cell size when the cell is viewed from above.

Accordingly, in the trench MOSFET of the third embodiment, the configuration in which the source contact electrode and the p well contact electrode are provided in the trench largely contributes to the reduction of the cell size. Therefore, the structure also largely contributes to the reduction of the channel on-resistance per unit area of the device.

Figure 13:
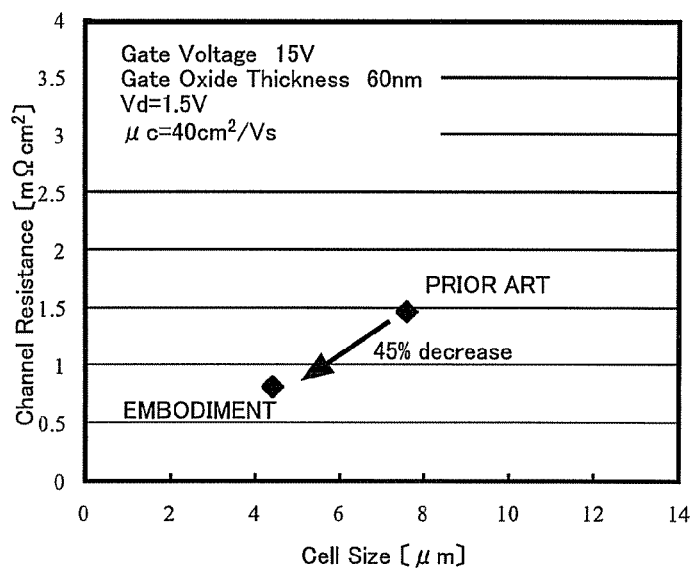
FIG. 13 is a view illustrating an example of the channel resistance reducing effect in the third embodiment.

FIG. 13 is a view illustrating an example of the channel resistance reducing effects in the prior art and the third embodiment. A horizontal axis indicates a cell size as a length (X in FIG. 13) in section of FIG. 12. A vertical axis indicates a channel resistance per 1 square centimeter in the surface. The measurement is performed under conditions illustrated in FIG. 13.

In the example of FIG. 13, the trench MOSFET of the prior art has the cell size of 7.6 μm. In the cell size of 7.6 μm, 6.6 μm is the region where the contact is formed. At this point, it is assumed that the contact electrode is made of a single material. According to the third embodiment, compared with the prior art, the region where the contact is formed can be reduced to 3.4 μm from 6.6 μm by forming the trench, which allows the finer processing of the cell size to be achieved to 4.5 μm. As a result, as illustrated in FIG. 13, the channel resistance can be decreased by 45% compared with the prior art.

In the prior art, the cell size is enlarged to 8.6 μm when the source contact electrode 24 and the p well contact electrode 26 are made of the different materials like the third embodiment. The reduced amount of channel resistance is further increased when the third embodiment is compared to the case in which the source contact electrode 24 and the p well contact electrode 26 are made of the different materials.

A method for producing the semiconductor device of the third embodiment will be described below. FIGS. 14 to 20 are process sectional views illustrating the method for producing the semiconductor device of the third embodiment.

Figure 14:
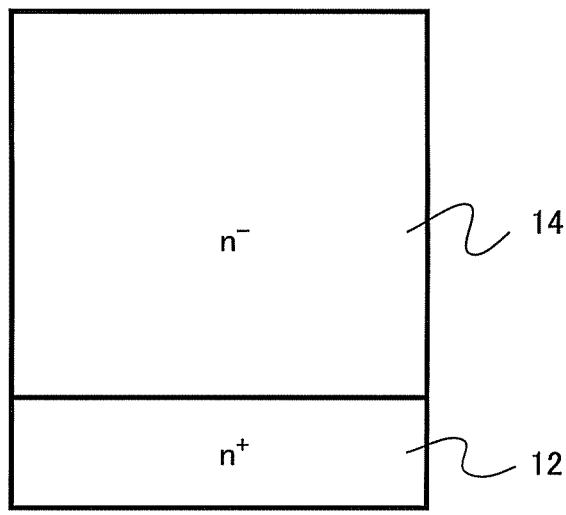
FIG. 14 is a process sectional view illustrating a method for producing the semiconductor device of the third embodiment.

As illustrated in FIG. 14, the low-resistance SiC substrate 12 having the hexagonal crystal lattice is prepared. The SiC substrate 12 contains P (phosphorus) or N (nitrogen) as the n type impurity of which the impurity concentration is about $1 \times 10^{19}$ cm$^{-3}$, and the SiC substrate 12 has the thickness of 300 µm. The high-resistance SiC layer 14 having the thickness of about 10 µm is grown on the SiC substrate 12 by the epitaxial growth. The SiC layer 14 contains N as the n type impurity having the impurity concentration of about $1 \times 10^{16}$ cm$^{-3}$.

Figure 15:
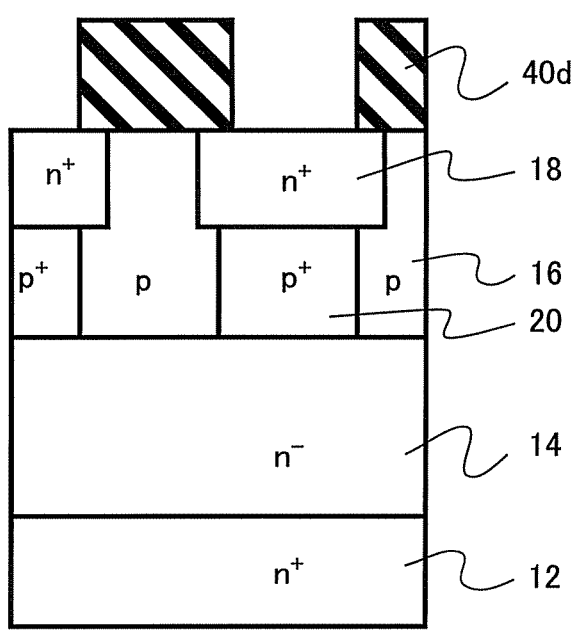
FIG. 15 is a process sectional view illustrating the method for producing the semiconductor device of the third embodiment.

As illustrated in FIG. 15, Al that is of the p type impurity is ion-implanted in the whole surface of the SiC layer 14 to form the p well region 16. Alternatively, the p well region 16 may be formed by the epitaxial growth of the p type SiC. Then, SiO$_2$ (not illustrated) is patterned on the upper surface of the SiC layer 14 to form an ion implantation mask. Using the ion implantation mask, P that is of the n type impurity is ion-implanted in the SiC layer 14 to form the source region 18. Then, SiO$_2$ 40d is patterned on the upper surface of the SiC layer 14 to form an ion implantation mask. Using the ion implantation mask, Al that is of the p type impurity is ion-implanted in the SiC layer 14 to form the p well contact region 20. Then, for example, the ion-implanted impurity is activated by the heat treatment at the temperature of about 1600° C.

Figure 16:
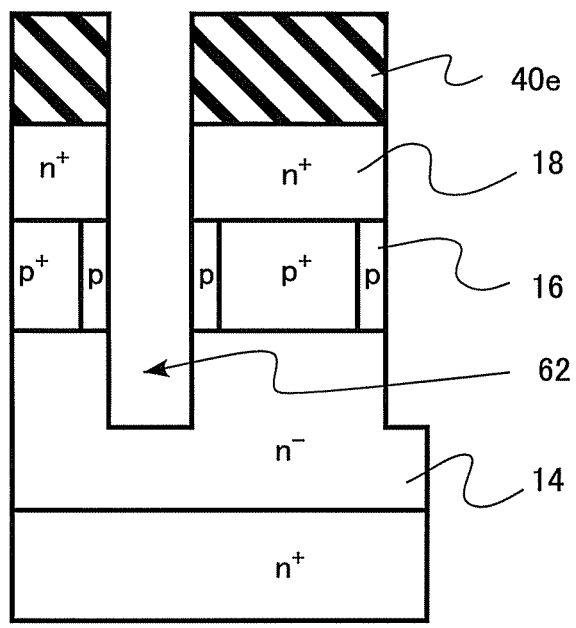
FIG. 16 is a process sectional view illustrating the method for producing the semiconductor device of the third embodiment.

As illustrated in FIG. 16, a resist 40e is patterned on the upper surface of the SiC layer 14 to form a trench etching mask. Using the trench etching mask, the first trench 62 is formed by, for example, the RIE method so as to pierce through the source region 18 and the p well region 16 to reach the n$^-$ layer 14.

Figure 17:
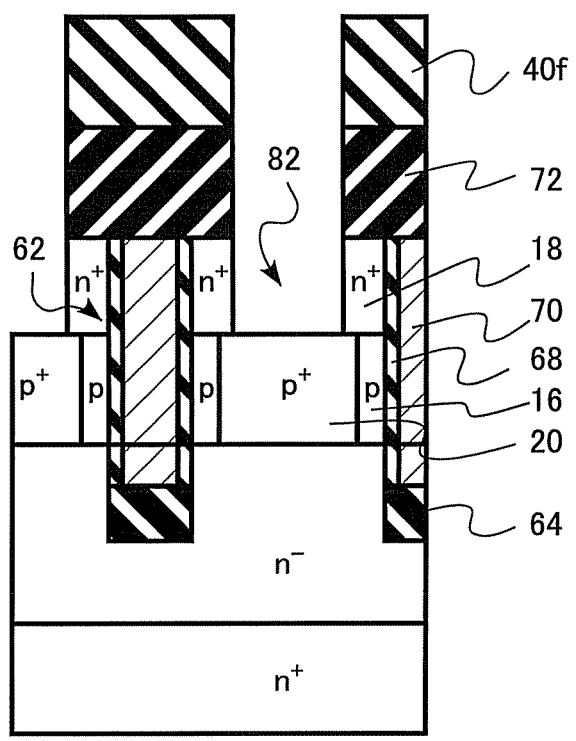
FIG. 17 is a process sectional view illustrating the method for producing the semiconductor device of the third embodiment.

As illustrated in FIG. 17, the resist 40e is peeled off. The insulator 64 is formed in the bottom portion of the first trench 62. In the side surface of the first trench 62, the gate insulating film 68 is continuously formed on the surfaces of the source region 18, the p well region 16, and the n$^-$ layer 14. For example, the gate insulating film 68 is formed by the thermal oxidation method or the CVD method. After the polysilicon film is deposited on the gate insulating film 68, the gate electrode 70 is formed by CPM or the like while the polysilicon film is left only in the first trench 62.

Then the interlayer insulating film 72 that is of the silicon oxide film is deposited on the gate electrode 30. Then the interlayer insulating film 72 is patterned by the RIE method with a resist 40f as the mask. Using the same resist mask, the second trench 82 is formed by, for example, the RIE method while piercing through the source region 18 to reach the p well contact region 20.

Figure 18:
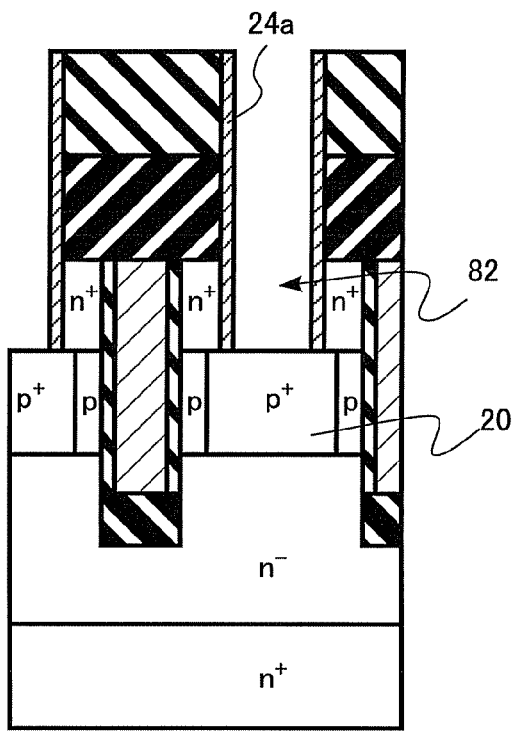
FIG. 18 is a process sectional view illustrating the method for producing the semiconductor device of the third embodiment.

As illustrated in FIG. 18, for example, the metallic film 24a made of Ni is deposited by the evaporation method or the sputtering method. Then, the metallic film 24a in the bottom portion of the second trench 82 is removed by the anisotropic etching such as the RIE method.

Figure 19:
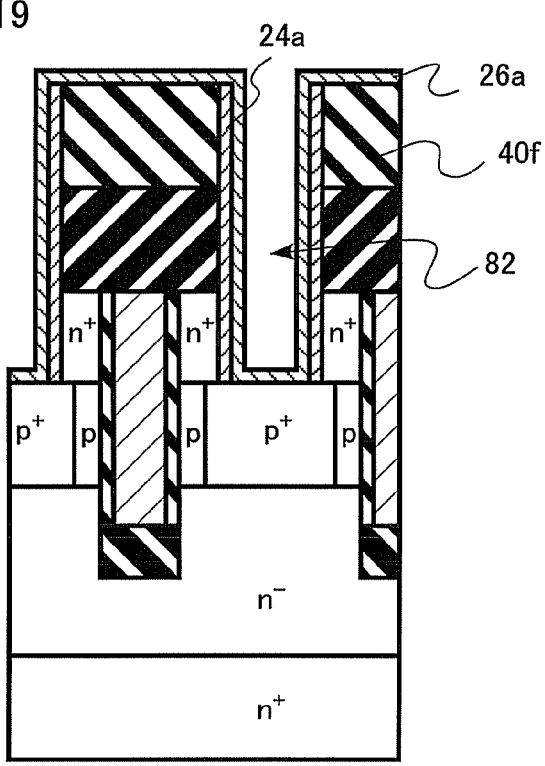
FIG. 19 is a process sectional view illustrating the method for producing the semiconductor device of the third embodiment.

As illustrated in FIG. 19, for example, the metallic film 26a made of Ti and Al is deposited by the sputtering method.

Figure 20:
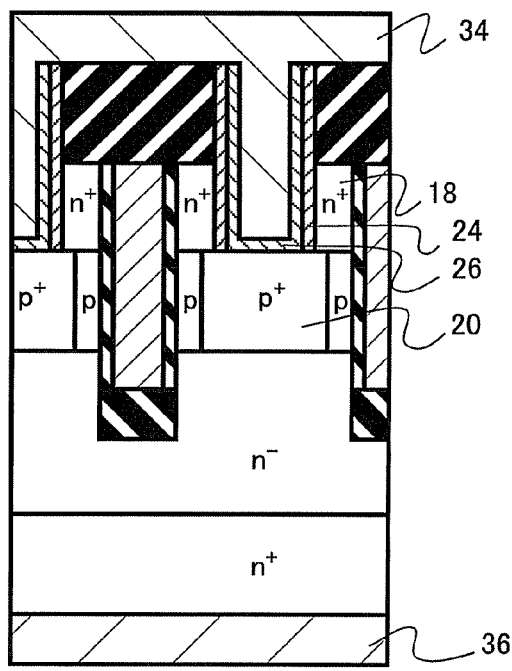
FIG. 20 is a process sectional view illustrating the method for producing the semiconductor device of the third embodiment.

As illustrated in FIG. 20, the unnecessary metallic film is lifted off by peeling off the resist 40f.

Thus, the first electrode 24 is formed on the source region 18 and the side surface of the interlayer insulating film 72 on the side surface of the second trench 82 while containing the metallic element selected from the group consisting of Ni, Ti, Ta, Mo, and W, and the first electrode 24 is formed on the p well contact region 20 in the bottom portion of the second trench 82 and on the first electrode 24 in the side surface of the second trench 82 while containing Al.

Then, for example, the metallic film made of Ni is evaporated to form the second main electrode 36 on the second principal surface side, namely, the rear surface side of the SiC substrate 12. The second main electrode 36 is the drain electrode. Then, for example, the Ni metallic film is caused to react with the SiC substrate 12 by the heat treatment at the temperature of about 950° C. At the same time, the metallic films 24a and 26a are caused to react with SiC of the source region 18 and SiC of the p well contact region 20.

Then, the metallic film made of Al is deposited on the first electrode 24 and the second electrode 26 by, for example, the sputtering method to form the first main electrode 34. The first main electrode 34 is the source-p well common electrode. Therefore, the MOSFET 300 of FIG. 12 is formed.

According to the method for producing the semiconductor device of the third embodiment, the ultra-low-on-resistance, high-driving-performance, excellent-reliability MOSFET can be produced through the simple process.

Fourth Embodiment

The MOSFET of the third embodiment has the n type SiC substrate. On the other hand, a semiconductor device according to a fourth embodiment has a p type SiC substrate to constitute an IGBT (Insulated Gate Bipolar Transistor). The overlapping description is not repeated here because the fourth embodiment differs from the third embodiment only in the impurity type of the SiC substrate.

Figure 21:
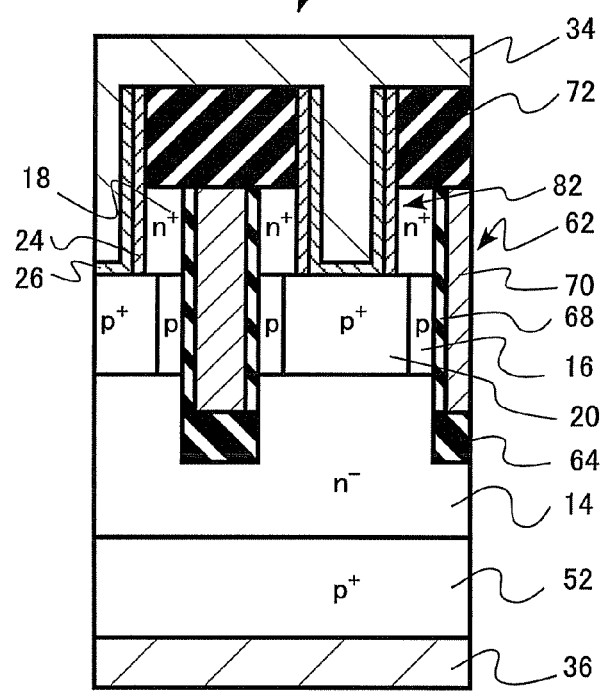
FIG. 21 is a sectional view illustrating a configuration of an IGBT that is of a semiconductor device according to a fourth embodiment.

FIG. 21 is a sectional view illustrating a configuration of the IGBT that is of the semiconductor device of the fourth embodiment. An IGBT 400 includes the SiC substrate (silicon carbide substrate) 52 having the first and second principal surfaces. In FIG. 21, the first principal surface means the upside surface while the second principal surface means the downside surface. For example, the SiC substrate 52 is a hexagonal SiC substrate (p$^+$ substrate) containing Al as the p type impurity of which the impurity concentration ranges from about $5 \times 10^{18}$ to about $1 \times 10^{19}$ cm$^{-3}$.

The IGBT 400 of the fourth embodiment has the configuration in which the source contact electrode and the p well contact electrode are provided in the trench, which allows the reduction of the contact resistance and the finer processing of the cell size to be simultaneously achieved. The structure of the trench MOSFET of the fourth embodiment can further achieve the fine processing of the cell size compared with the IGBT of the second embodiment. Accordingly, the ultra-low-on-resistance, high-driving performance, excellent-reliability IGBT can be implemented in the fourth embodiment.

The method for producing the semiconductor device of the fourth embodiment differs from that of the third embodiment only in that the prepared SiC substrate is the hexagonal SiC substrate (p substrate) containing, for example, Al as the p type impurity. According to the method for producing the semiconductor device of the fourth embodiment, the ultra-low-on-resistance, high-driving-performance, excellent-reliability IGBT can be produced through the simple process.

Fifth Embodiment

A semiconductor device according to a fifth embodiment differs from that of the first embodiment in that a sidewall insulating film formed by a silicon nitride film is sandwiched between the interlayer insulating film that is of the silicon oxide film and the first electrode. Therefore, the descriptions of contents overlapping those of the first embodiment are not repeated here.

Figure 22:
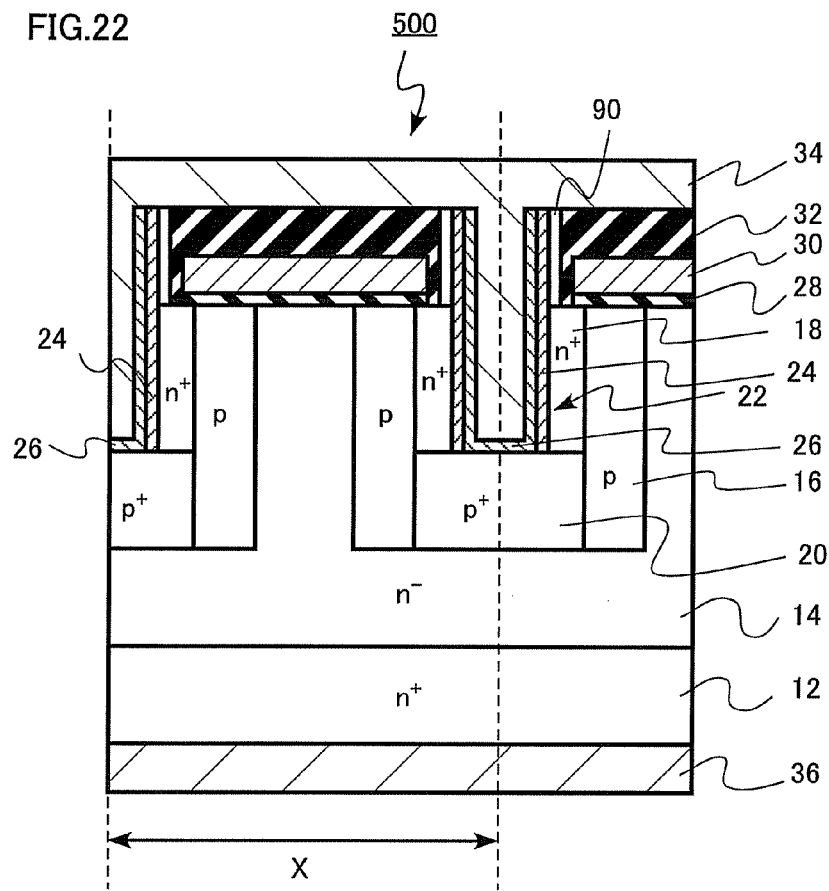
FIG. 22 is a sectional view illustrating a configuration of a MOSFET that is of a semiconductor device according to a fifth embodiment.

FIG. 22 is a sectional view illustrating a configuration of a MOSFET that is of the semiconductor device of the fifth embodiment. In a MOSFET 500, a sidewall insulating film 90 formed by the silicon nitride film is sandwiched between the interlayer insulating film 32 and the first electrode (source contact electrode) 24 containing the metallic element selected from the group consisting of Ni, Ti, Ta, Mo, and W.

The silicon nitride film is lower than the silicon oxide film in the reactivity with Al or the metallic element that is contained in the first electrode 24 or the second electrode 26 and selected from the group consisting of Ni, Ti, Ta, Mo, and W. According to the fourth embodiment, the reaction between the interlayer insulating film 32 and the Al or the metallic element selected from the group consisting of Ni, Ti, Ta, Mo, and W is suppressed, and the semiconductor device having the reliability superior to that of the first embodiment can be implemented.

Figure 23:
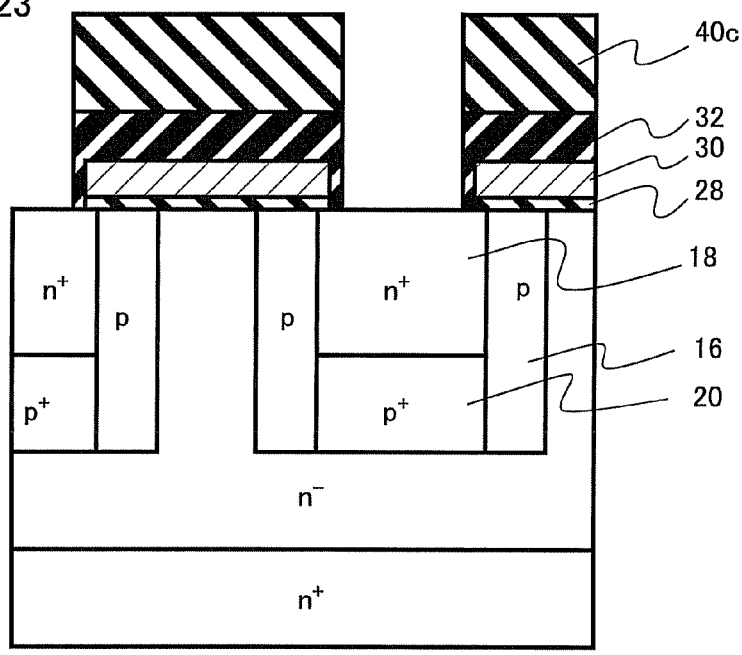
FIG. 23 is a process sectional view illustrating a method for producing the semiconductor device of the fifth embodiment.
Figure 24:
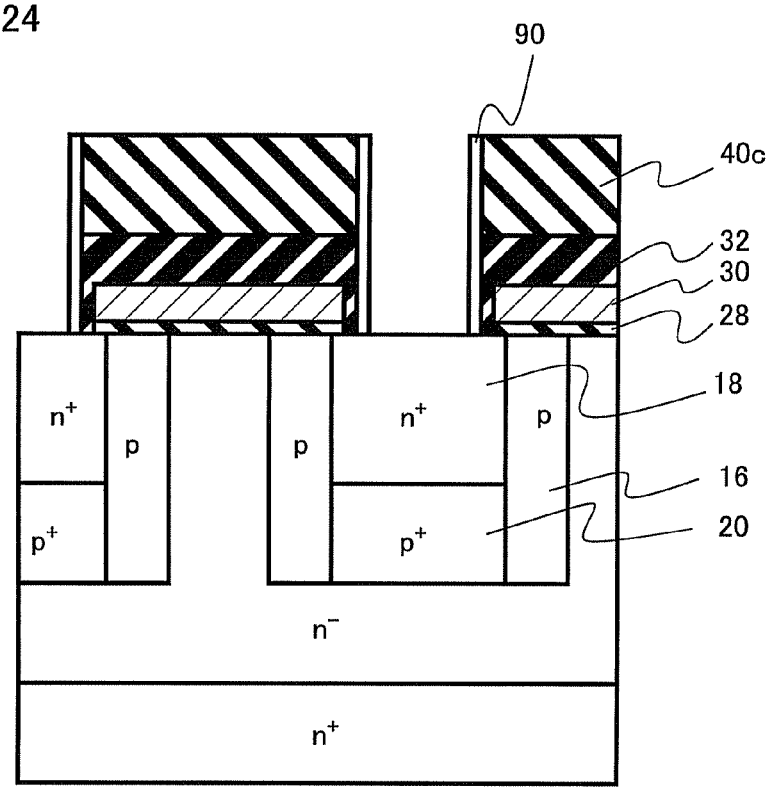
FIG. 24 is a process sectional view illustrating the method for producing the semiconductor device of the fifth embodiment.
Figure 25:
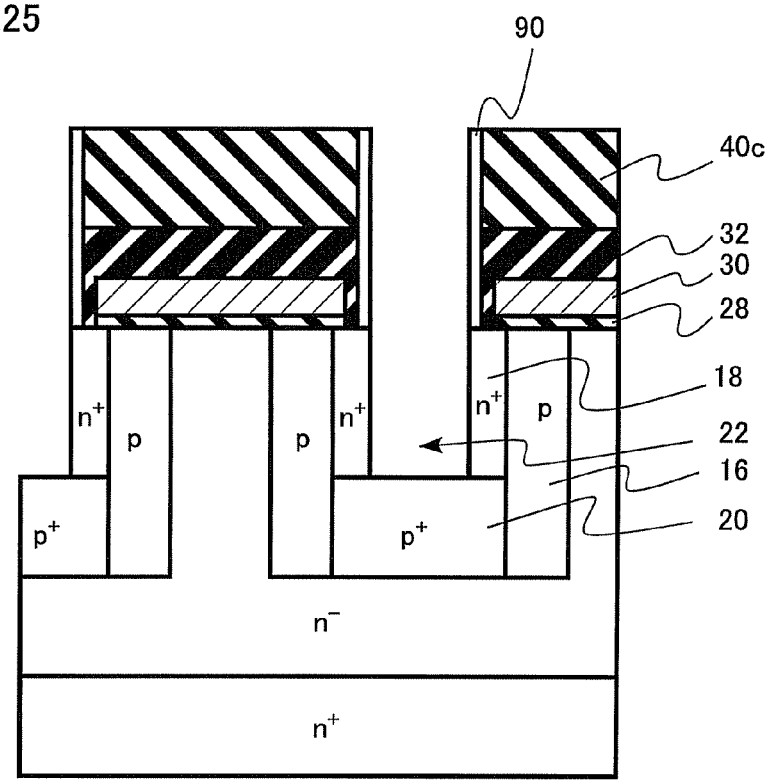
FIG. 25 is a process sectional view illustrating the method for producing the semiconductor device of the fifth embodiment.

FIGS. 23 to 25 are process sectional views illustrating a method for producing the semiconductor device of the fifth embodiment. The point different from that of the producing method of the first embodiment will mainly be described with reference to FIGS. 23 to 25. The fifth embodiment differs from the first embodiment in that the sidewall insulating film 90 formed by the silicon nitride film is formed between the interlayer insulating film 32 and the first electrode 24.

As illustrated in FIG. 23, the producing method of the fifth embodiment is identical to that of the first embodiment until the interlayer insulating film 32 is deposited on the gate electrode 30 to pattern the interlayer insulating film 32 by the RIE method with the resist 40*c* as the mask.

As illustrated in FIG. 24, for example, after the silicon nitride film is deposited by the sputtering method, the sidewall insulating film 90 formed by the silicon nitride film is formed by the RIE method while the silicon nitride film is left on the sidewall of the interlayer insulating film 32.

As illustrated in FIG. 25, with the resist 40*c* and the sidewall insulating film 90 as the mask, the trench 22 is formed by, for example, the RIE method while piercing through the source region 18 to reach the p well contact region 20.

Then, the MOSFET 500 can be produced using the same producing method as that of the first embodiment.

Sixth Embodiment

A semiconductor device according to a sixth embodiment differs from that of the third embodiment in that the sidewall insulating film formed by the silicon nitride film is sandwiched between the interlayer insulating film that is of the silicon oxide film and the first electrode. Therefore, the descriptions of contents overlapping those of the third embodiment are not repeated here.

Figure 26:
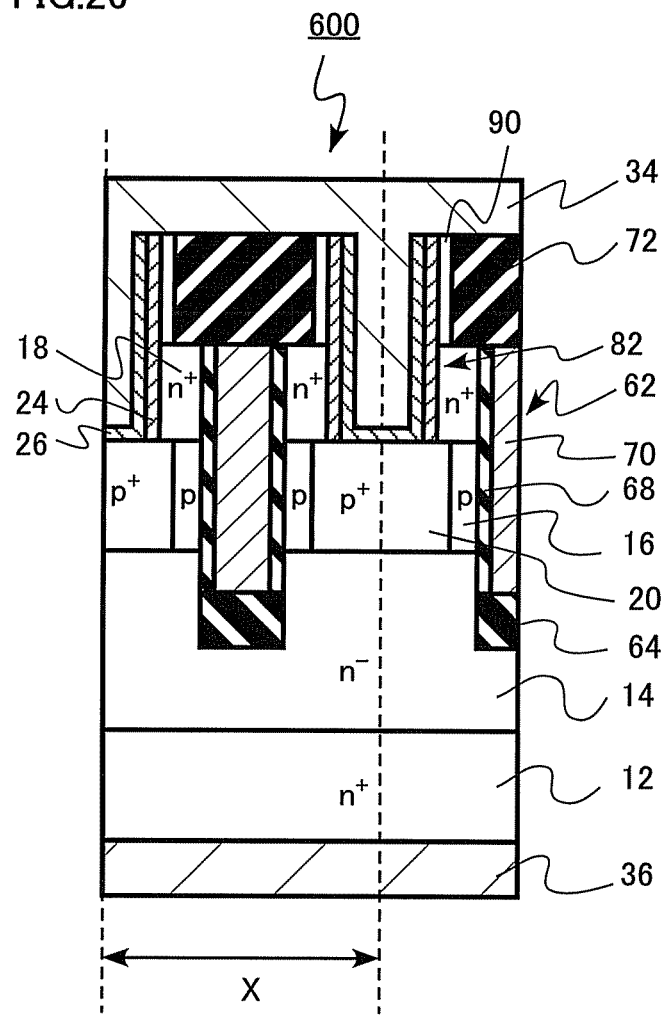
FIG. 26 is a sectional view illustrating a configuration of a MOSFET that is of a semiconductor device according to a sixth embodiment.

FIG. 26 is a sectional view illustrating a configuration of a MOSFET that is of the semiconductor device of the sixth embodiment. In a MOSFET 600, the sidewall insulating film 90 formed by the silicon nitride film is sandwiched between the interlayer insulating film 72 and the first electrode (source contact electrode) 24 containing the metallic element selected from the group consisting of Ni, Ti, Ta, Mo, and W.

The silicon nitride film is lower than the silicon oxide film in the reactivity with Al or the metallic element that is contained in the first electrode 24 or the second electrode 26 and selected from the group consisting of Ni, Ti, Ta, Mo, and W. According to the sixth embodiment, the reaction between the interlayer insulating film 72 and Al or the metallic element selected from the group consisting of Ni, Ti, Ta, Mo, and W is suppressed, and the semiconductor device having the reliability superior to that of the third embodiment can be implemented.

In the method for producing the MOSFET of the third embodiment, the MOSFET 600 of FIG. 26 can be produced by adding the process of forming the sidewall insulating film 90 similarly to the fifth embodiment.

The embodiments of the invention are described above with reference to the specific examples. The embodiments are described only by way of example, but the invention is not limited to the embodiments. A part that is not directly relates to the semiconductor device and the semiconductor device producing method of the invention is omitted in the descriptions of the embodiments. However, a necessary constituent relating to the semiconductor device and the semiconductor device producing method of the invention can appropriately be selected and used.

For example, the n type MOSFET and the n type IGBT, in which the electron is used as the carrier, are described in the embodiments. However, the invention can be applied to a p type MOSFET and a p type IGBT in which the hole is used as the carrier.

It is understood that the design changes of the semiconductor device and the semiconductor device producing method will be apparent to those skilled in the art without departing from the scope of the invention. The scope of the invention should be defined by claims and an equivalent thereto.

REFERENCE SIGNS LIST

12 SiC substrate (silicon carbide substrate)
14 First SiC layer (n− layer)
16 First SiC region (p well region)
18 Second SiC region (source region)
20 Third SiC region (p well contact region)
22 Trench
25 First electrode (source contact electrode)
24*a* Metallic film containing metallic element selected from group consisting of Ni, Ti, Ta, Mo, and W
26 Second electrode (p well contact electrode)
26*a* Metallic film containing Al
28 Gate insulating film
30 Gate electrode
32 Interlayer insulating film
34 First main electrode
36 Second main electrode
40*a* to 40*f* Resist
52 SiC substrate
62 First trench
64 Insulator
68 Gate insulating film
70 Gate electrode
72 Interlayer insulating film
82 Second trench
90 Sidewall insulating film
100 MOSFET
200 IGBT
300 MOSFET
400 IGBT
500 MOSFET
600 MOSFET

The invention claimed is:
1. A semiconductor device comprising:
a silicon carbide substrate that has first and second principal surfaces;

a first-conductive-type first silicon carbide layer that is provided on the first principal surface of the silicon carbide substrate;

a second-conductive-type first silicon carbide region that is formed at a surface of the first silicon carbide layer;

a first-conductive-type second silicon carbide region that is formed at a surface of the first silicon carbide region;

a second-conductive-type third silicon carbide region that is formed below the second silicon carbide region;

a trench that is formed so as to pierce through the second silicon carbide region to reach the third silicon carbide region;

a gate insulating film that is continuously formed on surfaces of the second silicon carbide region, the first silicon carbide region, and the first silicon carbide layer;

a gate electrode that is formed on the gate insulating film;

an interlayer insulating film with which the gate electrode is covered;

a first electrode that is formed directly on the second silicon carbide region and the interlayer insulating film on a side surface of the trench while containing a metallic element selected from a group consisting of Ni, Ti, Ta, Mo, and W;

a second electrode that is formed directly on the third silicon carbide region in a bottom portion of the trench and on the first electrode while containing Al;

a first main electrode that is formed on the second electrode; and a second main electrode that is formed on the second principal surface of the silicon carbide substrate.

2. The semiconductor device according to claim 1, wherein the interlayer insulating film is a silicon oxide film.

3. The semiconductor device according to claim 2, wherein a sidewall insulating film formed by a silicon nitride film is sandwiched between the interlayer insulating film and the first electrode.

4. The semiconductor device according to claim 1, wherein the silicon carbide substrate is the first conductive type and the device is a MOSFET.

5. The semiconductor device according to claim 1, wherein the silicon carbide substrate is the second conductive type and the device is an IGBT.

6. A semiconductor device comprising:

a silicon carbide substrate that has first and second principal surfaces;

a first-conductive-type first silicon carbide layer that is provided on the first principal surface of the silicon carbide substrate;

a second-conductive-type first silicon carbide region that is formed at a surface of the first silicon carbide layer;

a first-conductive-type second silicon carbide region that is formed at a surface of the first silicon carbide region;

a second-conductive-type third silicon carbide region that is selectively formed in the first silicon carbide region;

a first trench that is formed so as to pierce through the second silicon carbide region and the first silicon carbide region to reach the first silicon carbide layer;

an insulator that is formed in a bottom portion of the first trench;

a gate insulating film that is continuously formed on surfaces of the second silicon carbide region, the first silicon carbide region, and the first silicon carbide layer on a side surface of the first trench;

a gate electrode that is formed on the gate insulating film;

an interlayer insulating film with which the gate electrode is covered;

a second trench that is formed so as to pierce through the second silicon carbide region to reach the third silicon carbide region;

a first electrode that is formed directly on the second silicon carbide region and the interlayer insulating film on a side surface of the second trench while containing a metallic element selected from a group consisting of Ni, Ti, Ta, Mo, and W;

a second electrode that is formed directly on the third silicon carbide region in a bottom portion of the second trench and on the first electrode while containing Al;

a first main electrode that is formed on the second electrode; and a second main electrode, that is formed on the second principal surface of the silicon carbide substrate.

7. The semiconductor device according to claim 6, wherein the interlayer insulating film is a silicon oxide film.

8. The semiconductor device according to claim 7, wherein a sidewall insulating film formed by a silicon nitride film is sandwiched between the interlayer insulating film and the first electrode.

9. The semiconductor device according to claim 6, wherein the silicon carbide substrate is the first conductive type and the device is a MOSFET.

10. The semiconductor device according to claim 6, wherein the silicon carbide substrate is the second conductive type and the device is an IGBT.

* * * * *